United States Patent
Bardouillet et al.

(10) Patent No.: US 7,660,182 B2
(45) Date of Patent: *Feb. 9, 2010

(54) EXTRACTION AND STABILIZATION OF A BINARY CODE BASED ON PHYSICAL PARAMETERS OF AN INTEGRATED CIRCUIT

(75) Inventors: Michel Bardouillet, Rousset (FR); Pierre Rizzo, Aix En Provence (FR); Alexandre Malherbe, Trets (FR); Luc Wuidart, Pourrieres (FR)

(73) Assignee: STMicroelectronics Inc., Carrollton, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/930,180

(22) Filed: Oct. 31, 2007

(65) Prior Publication Data

US 2008/0130348 A1 Jun. 5, 2008

Related U.S. Application Data

(62) Division of application No. 10/364,759, filed on Feb. 11, 2003, now Pat. No. 7,333,386.

(30) Foreign Application Priority Data

Feb. 11, 2002 (FR) .................................. 02 01638
Oct. 29, 2002 (FR) .................................. 02 13556

(51) Int. Cl.
*G11C 7/24* (2006.01)

(52) U.S. Cl. ..................... 365/228; 365/225.7; 365/148; 365/208; 365/207; 365/200

(58) Field of Classification Search ................. 365/156, 365/154, 148, 228, 225.7, 96, 200, 201, 208, 365/207
See application file for complete search history.

(56) References Cited

U.S. PATENT DOCUMENTS

| 3,636,530 A | 1/1972 | Mark et al. |
| 5,708,291 A | 1/1998 | Bohr et al. |
| 5,818,738 A | 10/1998 | Effing |
| 5,969,404 A | 10/1999 | Bohr et al. |
| 6,115,283 A | 9/2000 | Hidaka |
| 6,161,213 A | 12/2000 | Lofstrom |
| 6,258,700 B1 | 7/2001 | Bohr et al. |

(Continued)

FOREIGN PATENT DOCUMENTS

EP 0863546 A 9/1998

(Continued)

OTHER PUBLICATIONS

French Search Report from the French priority application No. 02/13556, filed Oct. 29, 2002.

*Primary Examiner*—Andrew Q Tran
(74) *Attorney, Agent, or Firm*—Lisa K. Jorgenson; James H. Morris; Wolf, Greenfield & Sacks, P.C.

(57) ABSTRACT

An integrated cell for extracting a binary value based on a value difference between two resistors values, including connection circuitry for a binary reading of the sign of the difference between the resistors, and connection circuitry for a modification of the value of one of the resistors to make the sign of the difference invariable.

6 Claims, 6 Drawing Sheets

U.S. PATENT DOCUMENTS

| | | |
|---|---|---|
| 6,297,083 B1 | 10/2001 | Klein |
| 6,337,507 B1 | 1/2002 | Bohr et al. |
| 6,400,632 B1 | 6/2002 | Tanizaki |
| 6,469,923 B1 | 10/2002 | Hidaka |
| 6,757,832 B1 * | 6/2004 | Silverbrook et al. ........ 713/194 |
| 6,836,430 B2 | 12/2004 | Wuidart et al. |
| 7,036,005 B2 * | 4/2006 | Nalawadi et al. ............... 713/1 |
| 7,333,386 B2 * | 2/2008 | Bardouillet et al. ......... 365/228 |
| 2002/0060941 A1 | 5/2002 | Casper et al. |
| 2003/0046480 A1 * | 3/2003 | Rzittka ....................... 711/103 |
| 2003/0056122 A1 | 3/2003 | Wuidart |
| 2003/0151539 A1 | 8/2003 | Wuidart et al. |
| 2005/0162892 A1 | 7/2005 | Bardouillet et al. |
| 2005/0173779 A1 | 8/2005 | Wuidart et al. |

FOREIGN PATENT DOCUMENTS

| | | |
|---|---|---|
| GB | 2 000 407 A | 1/1979 |
| JP | 2-42760 A | 2/1990 |
| JP | 04-155696 | 5/1992 |
| JP | 05-101687 | 4/1993 |
| JP | 10-208491 | 8/1998 |
| JP | 11-162172 | 6/1999 |
| JP | 2000-182393 | 6/2000 |
| JP | 2001-118996 | 4/2001 |

* cited by examiner

EXTRACTION AND STABILIZATION OF A BINARY CODE BASED ON PHYSICAL PARAMETERS OF AN INTEGRATED CIRCUIT

RELATED APPLICATIONS

This application is a division of prior application Ser. No. 10/364,759, filed on Jan. 11, 2003, entitled EXTRACTION OF A BINARY CODE BASED ON PHYSICAL PARAMETERS OF AN INTEGRATED CIRCUIT which application is incorporated herein by reference in its entirety.

BACKGROUND OF THE INVENTION

1. Field of the Invention

The present invention relates to storing, in an integrated circuit, an immutable binary code. The present invention more specifically relates to extraction, from an integrated circuit, a binary code resulting from parameters linked to the manufacturing of this circuit. Such parameters linked to the manufacturing are generally called physical parameters and are then provided by a physical parameter network (PPN). Such a binary code "embedded" in an integrated circuit is used, for example, to avoid its permanent storage, in the form of a digital word, in a register or the like and to prevent detection of this code. In an application to the identification of an electronic element or assembly based on parameters linked to the manufacturing of an identification circuit contained in an integrated circuit chip, this identification is currently designated as an "integrated circuit fingerprint".

The present invention more specifically relates to extracting a binary code stored in the form of at least partially resistive electric paths and interpreted by flip-flops or the like.

2. Discussion of the Related Art

Examples of circuits for storing such binary codes and for identification of an integrated circuit chip by such codes are described in U.S. Published Application Nos. 2004/0130363 and No. 2004/0125930 which are incorporated herein by reference.

The principle used by these circuits is to have the same electric edge that triggers a reading circulate in different electric paths reaching different flip-flops. According to whether the delay of a given path is shorter or longer than a reference or average delay synchronizing the flip-flop reading, the output state of the corresponding flip-flop is 0 or 1. The outputs of the different flip-flops then provide the binary code stored in the form of electric paths. These electric paths may be made different simply by the length of the tracks forming them, but it is preferable for them to contain a resistive element (in practice associated with a capacitive element formed of the gates of MOS transistors forming the flip-flops) to form an RC cell.

A considerable asset of such a binary code storage is that the code is stored, not directly in digital form, but, in a way, in analog form, which makes its piracy more difficult.

In the above-mentioned circuits, to fulfill the aim of making the code stored by the electric paths invisible, it must be ascertained that the paths are not too different (in terms of length) as compared to the electric path providing the reference delay. In the opposite case, there is a risk of enabling optical detection according to whether the path is obviously longer or shorter than the reference path.

Further, in some cases and in a perfectly random and unpredictable manner, an electric path of one of the flip-flops may, when associated with the propagation of the edge in this flip-flop, exhibit exactly the same delay as the average path. There then is a risk, for this flip-flop, of having a non-reproducible output state from one extraction to another of the binary code.

These two problems with the above-mentioned storage circuits are due to the use of an average delay to synchronize the flip-flop reading.

Another technique for binary code extraction consists of detecting a resistance difference between two branches of a cell. This difference is read by a voltage or current measurement. There again, in the case where the two cell resistances would be identical, a non-reproducible state is obtained from one extraction to another of the binary code.

A problem which arises whatever the read mode (time, current, voltage) is linked to the theoretical risk of having two strictly identical resistances.

Another problem is to make invisible (especially optically) the differences between resistances providing bits of different values.

SUMMARY OF THE INVENTION

The present invention aims at improving the extraction of a binary code embedded in an integrated circuit.

The present invention also aims at providing a circuit for storing a binary code originating from physical parameters of an integrated circuit, which overcomes the disadvantages of the above-mentioned circuits.

In a propagation time measurement, the present invention more specifically aims at avoiding the use of a common reference or average electric path to compare the electric paths associated with the different flip-flops.

The present invention also aims at making the delays introduced by the different electric paths of such a flip-flop circuit, or the differences between the resistances of a voltage or current measurement cell, undetectable.

The present invention also aims at providing a solution which is compatible with the technology currently used to form MOS transistors and which, in particular, does not require additional manufacturing steps.

To achieve these and other objects, the present invention provides an integrated cell for extracting a binary value based on a value difference between two resistances, comprising:

connection means for a binary reading of the sign of the value difference between said resistances; and connection means for a modification of the value of one of said resistances to make said value difference sign invariable.

According to an embodiment of the present invention, the cell comprising means for binarily reading said sign of the difference between said resistors.

According to an embodiment of the present invention, said value modification comprises decreasing, in an irreversible and stable manner, within the read operating current range of the cell, the value of one of said resistors.

According to an embodiment of the present invention, the resistors are made of polysilicon and are sized to have identical nominal values.

According to an embodiment of the present invention, the value decrease is caused by temporarily applying, in the corresponding resistor, a current that is greater than the current for which the value of the resistance is maximum.

According to an embodiment of the present invention, the cell is applied to the extraction of a binary value based on a propagation of an edge of a triggering signal in two electric paths, and comprises, between two terminals of application of a voltage, two parallel branches each comprising, in series:

one of the resistors for differentiating the electric paths;

a read transistor, the junction point of the resistor and of the read transistor of each branch defining an output terminal of the cell, and the gate of the read transistor of each branch being connected to the output terminal of the other branch; and a selection transistor.

According to an embodiment of the present invention, each branch further comprises a stabilization transistor connecting its output terminal to the terminal of application of a voltage opposite to that to which the resistor of the involved branch is connected.

According to an embodiment of the present invention, the stabilization transistors are used to cause the decrease in the value of one of the resistances.

According to an embodiment of the present invention, the voltage is chosen from a relatively low read voltage and a relatively high voltage of stabilization of the initial cell state.

According to an embodiment of the present invention, the cell comprises:

two parallel branches each comprising one of the resistors connected between a first supply terminal and a terminal for differentially reading the cell state; and at least one programming switch connecting one of the read terminals to a second terminal of application of the supply voltage.

According to an embodiment of the present invention, each branch comprises a programming switch.

According to an embodiment of the present invention, one of the supply terminals is connected, via a selector, to at least two supply voltages, among which a relatively low read operation supply voltage and a relatively high stabilization supply voltage.

According to an embodiment of the present invention, at least one selection transistor is connected in series with each the resistor between the first supply terminal and the corresponding read terminal.

According to an embodiment of the present invention, each resistor is connected to the second supply terminal by a latch having its control terminal connected to the resistor of the other branch.

According to an embodiment of the present invention, the cell comprises a differential amplifier for reading the cell state.

According to an embodiment of the present invention, each branch comprises, on either side of its resistor, respectively, an N-channel transistor and a P-channel transistor, the gates of which are connected together to a terminal of the resistor of the other branch.

The present invention also provides a method for programming a memory cell, comprising, to make irreversible the sign of the difference between the two resistances, temporarily applying, in one of the resistors, a stabilization current greater than a current for which the value of the resistance of the involved branch exhibits a maximum.

According to an embodiment of the present invention, the method comprises the steps of:

increasing step-by-step the current in the selected resistor; and measuring, after each application of a higher current, the value of this resistor in its functional read environment.

According to an embodiment of the present invention, a predetermined table of correspondence between the stabilization current and the desired final resistance is used to apply, to the selected programming resistor, the adapted programming current.

According to an embodiment of the present invention, the method comprises the steps of:

causing the reading of an initial state of the cell; and temporarily submitting the resistor is associated with the branch providing a high output state, to a constraint current greater than a current for which the value of the resistance exhibits a maximum.

According to an embodiment of the present invention, the constraint current is selected from a predetermined table of correspondence between the constraint current and the desired final resistance.

The present invention also provides a circuit for storing and extracting a binary code over n bits in and from an integrated circuit chip, comprising:

n cells; and a central control unit.

According to an embodiment of the present invention, the n bits contained in the cells are extracted in parallel.

The present invention also provides a circuit for identifying an integrated circuit chip.

The foregoing objects, features and advantages of the present invention, will be discussed in detail in the following non-limiting description of specific embodiments in connection with the accompanying drawings.

DETAILED DESCRIPTION

The same elements have been designated with the same references in the different drawings. For clarity, only those elements that are necessary to the understanding of the present invention have been shown in the drawings and will be described hereafter. In particular, the different circuits for reading and exploiting the binary words stored in the circuit according to the present invention have not been described in detail. The present invention can be implemented whatever the exploitation made of the binary code depending on the integrated circuit's physical parameters. Further, the practical forming of a polysilicon resistor by deposition and etch has not been described in detail, the present invention being implementable on a conventionally-formed resistor.

A feature of the present invention is to detect an initial (native) difference between resistors conditioning a binary state to be extracted, and to confirm or stabilize (make invariable) the sign of this difference, whatever it may be.

In an embodiment applied to a time measurement, a feature of the present invention is to provide, within each read or extraction element of bistable or flip-flop type providing a bit of an embedded binary code, an electric reference path to be compared with an electric path representative of the embedded bit. More specifically, the present invention provides, for each bit of a binary code stored in the form of electric paths having different time constants, a differential structure of extraction of the corresponding bit.

In another embodiment applied to a differential voltage or current measurement, a feature of the present invention is to cause a reading of the difference between resistors by a resistance-to-voltage conversion at constant current or a resistance-to-current conversion at constant voltage. This reading, applied to the initial (native or after manufacturing) state is used to detect the sign of the difference between resistances which is then confirmed or stabilized, as will be seen hereafter.

Figure 1:
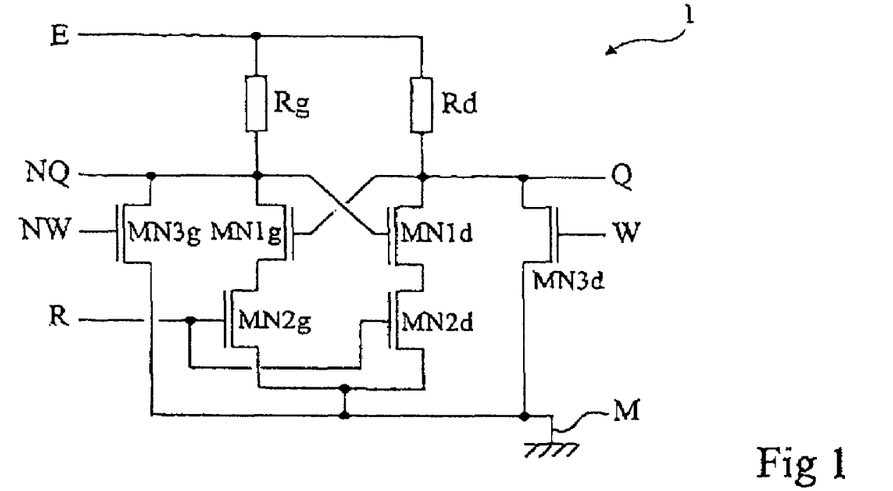
FIG. 1 shows a first embodiment of an integrated cell for storing a bit in the form of an electric path according to an embodiment of the present invention.

FIG. 1 shows the electric diagram of a cell 1 for extracting a bit stored in the form of an electric path according to an embodiment of the present invention.

Cell 1 comprises two parallel branches of identical structure between two terminals E and M of application of a voltage, terminal M representing the ground. This voltage which supplies the cell is, as will be seen hereafter, different according to whether an extraction or a reading of the bit, or a characteristic step of stabilization or confirmation of this bit, are performed.

A first branch, called the right-hand branch in the orientation of the drawing, comprises, in series, a resistor Rd, a first read MOS transistor MN1$d$, and a second selection MOS transistor MN2$d$. The interconnection between resistor Rd and transistor MN1$d$ (and thus the drain of this transistor) forms a first output terminal Q arbitrarily called the direct (non-inverted) output terminal. A second branch, called the left-hand branch in the orientation of the drawing, comprises, in series, a resistor Rg, a first read MOS transistor MN1$g$, and a second selection MOS transistor MN2$g$. The interconnection between resistor Rg and transistor MN1$g$ (and thus the drain of this transistor) forms a second output terminal NQ which is the inverse of terminal Q. The gate of transistor MN1$g$ is connected to terminal Q while the gate of transistor MN1$d$ is connected to terminal NQ to obtain the desired bistable effect. The gates of transistors MN2$g$ and MN2$d$ are connected together to a terminal R intended to receive a selection signal for reading from cell 1. In the example shown, all the transistors have N channels.

According to the present invention, resistors Rg and Rd are, in their manufacturing, identically sized to have the same value. These resistors belong to the electric paths associated with cell 1. They define, each with the gate of the transistor of the branch opposite to that to which they are respectively connected, an RC cell. These RC cells condition the time constants of the electric paths connecting terminal E to terminals Q and NQ, respectively.

The operation of a cell according to the present invention such as described hereabove is, in read mode, the following. Input terminal R receives a read configuration or extraction signal (high state), turning on the two transistors MN2$g$ and MN2$d$.

Afterwards, an edge (positive with the biasings of this embodiment) is applied on input E of the above-described cell. The occurrence of this edge on terminals Q and NQ should be simultaneous if the components were all strictly identical. In practice, such is not the case, if only due to technological and manufacturing process dispersions. As a result, one of terminals Q and NQ sees its voltage increase faster than the other. This imbalance turns on one of transistors MN1$g$ and MN1$d$. Due to the crossing of the gates of these transistors, that which is on first is that of which the gate takes part in the electric path with the smallest time constant, and thus that of which the drain voltage increases slower than the other. Once on, this transistor MN1 forces its drain (and thus the corresponding output terminal Q or NQ) to ground, which confirms the blocking of the transistor MN1 of the other branch, and thus the high state on the corresponding output terminal.

Assuming that the time constant only differs due to a difference between the resistances (or that the other dispersions are negligible as compared to the value interval between the resistances), the resistance having the lowest value generates a smaller time constant.

The duration of the extraction signal applied on input E is of no importance. It is a two-state "digital" signal, the extraction or the reading being caused, in this example, by the rising edge. Afterwards, the disappearing of the high state removes the cell supply, and thus the stored bit.

To keep the undetectability of the code and make it dependent on technological and manufacturing process dispersions, it is important that resistors Rg and Rd are identical and that only their dispersion (which, in essence, is non-observable) should condition, at the end of the manufacturing, the bit extracted from the cell. Even if resistors Rg and Rd are strictly identical, the structure of cell 1 prevents it from taking an undetermined state. It will necessarily take a state, for example, according to other dispersions (between transistors, between the paths bringing the edge from terminal E, etc.).

An advantage of the present invention already appears, which is that, to read the content of a cell, no comparison with an element external to the cell is necessary.

To guarantee a reproducibility of the cell state (bit) for each reading, it is provided, according to another feature of the present invention, to stabilize this content upon first reading. In other words, in a starting, first use, configuration phase or the like, a first reading of the bit originating from the physical parameters is performed, after which a cell stabilization step is triggered.

Stabilization means, in the sense of the present invention, a lasting confirmation of the native value (resulting from the manufacturing) of the cell.

For this purpose, resistors Rg and Rd are, according to a feature of the present invention, polysilicon resistors, the respective values of which can be submitted to an permanent decrease, as will be discussed hereafter in relation with FIGS. 2 and 3. For the moment, it should only be noted that if resistor Rg or Rd is submitted to a so-called stabilization or confirmation current, greater than the maximum current given the resistance, the value of its resistance irreversibly decrease when returning to currents comprised in the nominal operation range. The nominal range of operating currents of a polysilicon resistor used according to the present invention is smaller than some hundred microamperes and, most often, smaller than some ten microamperes. The amplitude of the stabilization currents in on the order of a few milliamperes.

According to the present invention, the stabilization step comprises submitting to a high current as compared to the operating current range the resistor of the branch which has, in a first reading, exhibited a high state (thus indicating, in principle, a resistance of smaller value). This then confirms the cell state by notably decreasing the value of this resistance. Of course, the stabilization current must not be applied to the other resistor, which would then undergo an identical value decrease, which would cancel the expected confirmation effect.

To apply, in one of resistors Rg and Rd, a stabilization current greater than the operating currents of this resistor, terminal E is used, in the stabilization phase, for the application of a D.C. supply voltage Vp (here, positive). This supply voltage is, according to the present invention, greater than the cell use voltage Vr in the read mode, that is, than the high voltage of the edge applied on terminal E. Further, two MOS transistors MN3d and MN3g (in this example, with an N channel), respectively associated with each of the branches by connecting terminal Q, respectively NQ, to ground, are provided. The respective gates of the transistors form two stabilization control input terminals W and NW of the cell. A single one of transistors MN3g and MN3d is intended to be turned on during the stabilization step.

That of transistors MN3g and MN3d which is on short-circuits the two other transistors MN1 and MN2 of the concerned branch, and causes the flowing of a current through resistor Rg or Rd of this branch. Stabilization voltage Vp is chosen so that the current which then flows through resistor Rg or Rd is greater than the current for which this resistance exhibits a maximum value. This feature of the present invention will better appear from the description which will be made hereafter in relation with FIGS. 2 and 3.

Transistors MN2g and MN2d of the cell must be off in the stabilization phase (input R low). They are used to protect read transistors MN1g and MN2g by making their sources float. By disconnecting transistors MN1, transistors MN2 prevent them from seeing high voltage Vp across their terminals. Accordingly, transistors MN1 and MN2 can be sized according to read voltage Vr. Only transistors MN3g and MN3d need sizing to stand voltage Vp and bear the relatively high current (as compared to the read operating range) used to stabilize the cell.

Figure 2:
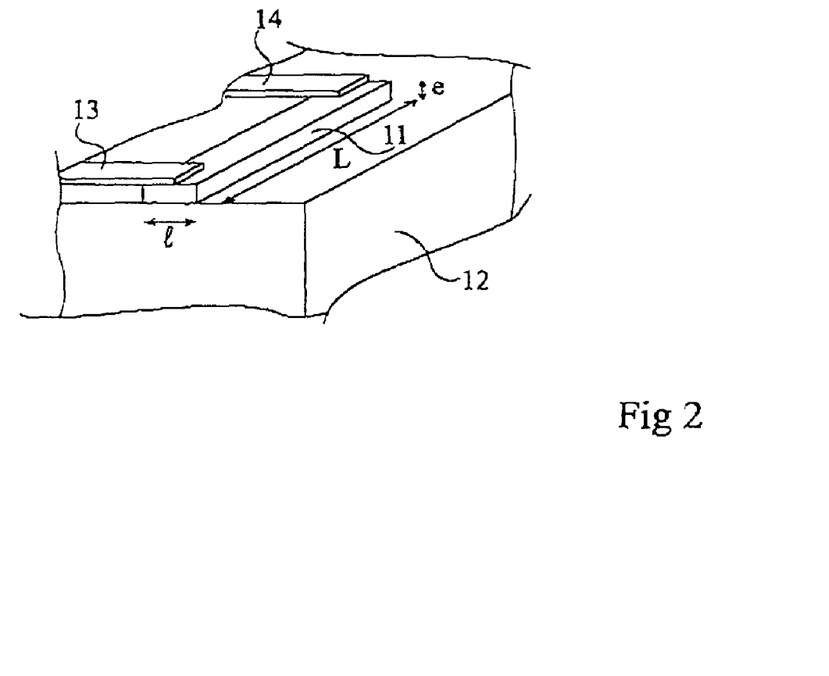
FIG. 2 shows, in a partial very simplified perspective view, an embodiment of a polysilicon resistor constitutive of an electric path according to the present invention.

FIG. 2 shows an embodiment of a polysilicon resistor used to form resistors Rd and Rg of a cell according to the present invention.

Such a resistor (designated as 11 in FIG. 2) is formed of a polysilicon track (also called a bar) obtained by etching of a layer deposited on an insulating substrate 12. Substrate 12 is formed of the integrated circuit substrate or is formed of an insulating layer forming an insulating substrate or the like for resistor 11. Resistor 11 is connected, by its two ends, to conductive tracks (for example, metal tracks) 13 and 14 intended to connect the resistive bar to the other integrated circuit elements. The simplified representation of FIG. 2 makes no reference to the different insulating and conductive layers generally forming the integrated circuit. To simplify, only resistive bar 11 laid on insulating substrate 12 and in contact, by the ends of its upper surface, with the two metal tracks 13 and 14, has been shown. In practice, the connections of resistive element 11 to the other integrated circuit components are obtained by wider polysilicon tracks starting from the ends of bar 11, in the alignment thereof. In other words, resistive element 11 is generally formed by making a section of a polysilicon track narrower than the rest of the track.

Resistance R of element 11 is given by the following formula:

$$R = \rho(L/s),$$

where $\rho$ designates the resistivity of the material (polysilicon, possibly doped) forming the track in which element 11 is etched, where L designates the length of element 11, and where s designates its section, that is, its width l by its thickness e. Resistivity $\rho$ of element 11 depends, among others, on the possible doping of the polysilicon forming it.

Most often, upon forming of an integrated circuit, the resistors are provided by referring to a notion of so-called square resistance R. This square resistance is defined as being the resistivity of the material divided by the thickness with which it is deposited. Taking the above relation giving the resistance of an element 11, the resistance is thus given by the following relation:

$$R = R*L/l.$$

Quotient L/l corresponds to what is called the number of squares forming resistive element 11. This represents, as seen from above, the number of squares of given dimension depending on the technology, put side by side to form element 11.

The value of the polysilicon resistance is thus defined, upon manufacturing, based on the above parameters, resulting in so-called nominal resistivities and resistances. Generally, thickness e of the polysilicon is set by other manufacturing parameters of the integrated circuit. For example, this thickness is set by the thickness desired for the gates of the integrated circuit MOS transistors.

A feature of the present invention is to temporarily apply, in a polysilicon resistor (Rg or Rd), the value of which is desired to be irreversibly decreased, a programming or constraint current greater than a maximum current given the resistance, this current being beyond the normal operating current range (in read mode) of this resistance. In other words, the resistivity of the polysilicon is decreased in the operating current range, in a stable and irreversible manner, by temporarily applying in the corresponding resistive element the flowing of a current beyond the operating current range.

Another feature of the present invention is that the current used to decrease the resistance value is, conversely to a fusible element, non-destructive for the polysilicon element.

Figure 3:
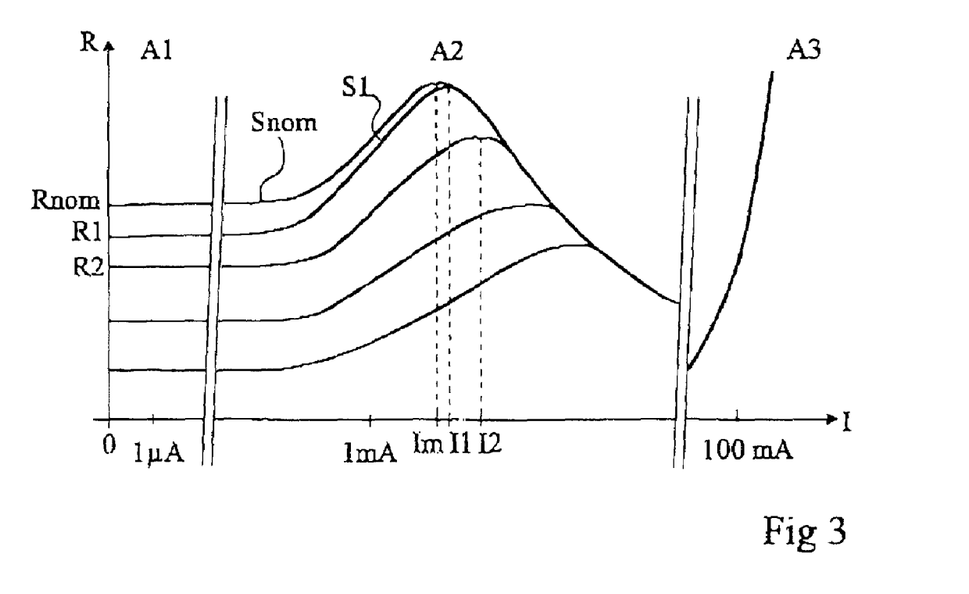
FIG. 3 illustrates, in a curve network, the stabilization of the value of an electric path according to an embodiment of the present invention.

FIG. 3 illustrates, with a curve network giving the resistance of a polysilicon element of the type shown in FIG. 2 according to the current flowing therethrough, an embodiment of the present invention for stabilizing a cell by decreasing the value of one of its resistors.

It is assumed that the polysilicon having been used to manufacture resistive element 11 (Rg or Rd) exhibits a nominal resistivity giving element 11, for the given dimensions l, L, and e, a resistance value Rnom. This nominal (original) value of the resistance corresponds to the value taken in a stable manner by resistive element 11 in the operating current range of the system, that is, generally, for currents smaller than 100 μA.

According to the present invention, to decrease the value of the resistance and to switch in an irreversible and stable manner, for example, to a value R1 smaller than Rnom, a so-called constraint current (for example, I1), greater than a current Im for which the value of resistance R of element 11 is maximum without being infinite, is applied across resistive element 11. As illustrated in FIG. 3, once current I1 has been applied to resistive element 11, a stable resistance of value R1 is obtained in range A1 of operating currents of the integrated circuit. In fact, curve Snom of the resistance according to the current is stable for relatively low currents (smaller than 100 μA). This curve starts increasing for substantially higher currents on the order of a few milliamperes, or even more (range A2). In this current range, curve Snom crosses a maximum for value Im. The resistance then progressively decreases. In FIG. 3, a third range A3 of currents corresponding to the range generally used to make fuses has been illustrated. These are currents on the order of one tenth of an ampere where the resistance starts abruptly increasing to become infinite. Accordingly, it can be considered that the present invention uses intermediary range A2 of currents between operating range A1 and destructive range A3, to irreversibly decrease the value of the resistance or more specifically of the resistivity of the polysilicon element.

Indeed, once the maximum of curve Snom of the resistivity according to the current has been passed, the value taken by the resistance in the operating current range is smaller than value Rnom. The new value, for example, R1, depends on the higher value of the current (here, I1) which has been applied during the irreversible current phase. It should indeed be noted that the irreversible decrease performed by the present invention occurs in a specific programming phase, outside of the normal extraction operating mode (range A1) of the integrated circuit, that is, outside of the normal resistor operation.

Theoretically, once the value of the polysilicon resistance has been lowered to a lower value (for example, R1 in FIG. 3), an irreversible decrease in this value can further be implemented. It is enough, to achieve this, to exceed maximum current I1 of the new shape S1 of the resistance according to the current. For example, the value of the current may be increased to reach a value I2. When the current is then decreased again, a value R2 is obtained for the resistor in its normal operating range. The value of R2 is smaller than value R1 and, of course, than value Rnom. In the application to a differential cell for extracting a bit such as shown in FIG. 1, this shows the irreversibility of the introduced stabilization. A second stabilization phase only, at most, enhances the decrease in the value of the resistance with respect to its nominal value, and thus only further confirms the state of the first detection.

It can be seen that all the curves of the resistance according to the current join on the decrease slope of the resistance value, after having crossed the maximum of the curve. Thus, for a given resistive element (ρ, L, s), currents I1, I2, etc. which must be reached, to switch to a smaller resistance value, are independent from the value of the resistance (Rnom, R1, R2) from which the decrease is caused.

What has been expressed hereabove as the resistance value corresponds in fact to a decrease in the resistivity of the polysilicon forming the resistive element. The present inventors consider that the polysilicon crystalline structure is modified in a stable manner and that, in a way, the material is reflowed, the obtained final crystalline structure depending on the maximum current reached. In fact, the constraint current causes a temperature rise of the silicon element, which causes a flow thereof.

Of course, it will be clear that the programming current range A2 (on the order of a few milliamperes) should not be exceeded in order to avoid destroying the polysilicon resistor. This precaution will pose no problem in practice since the use of polysilicon to form a fuse requires much higher currents (on the order of one tenth of an ampere) which are not available once the circuit has been manufactured.

The practical forming of a polysilicon resistor according to the present invention does not differ from the forming of a conventional resistor. Starting from an insulating substrate, a polysilicon layer is deposited and etched according to the dimensions desired for the resistance. Since the deposited polysilicon thickness is generally determined by the technology, the two dimensions which can be adjusted are the width and the length. Generally, an insulator is redeposited on the polysilicon bar thus obtained. In the case of an on-line interconnection, width l will have been modified with respect to the wider access tracks to be more strongly conductive. In the case of an access to the ends of the bar from the top as shown in FIG. 2, vias will be made in the overlying insulator (not shown) of the polysilicon bar to connect contact metal tracks 13 and 14.

In practice, to have the highest resistance adjustment capacity with a minimum constraint current, a minimum thickness and a minimum width will be desired to be used for the resistive elements. In this case, only length L conditions the nominal value of the resistance once the polysilicon structure has been set. The possible doping of the polysilicon, whatever its type, does not hinder the implementation of the present invention. The only difference linked to doping lies in the nominal resistivity before constraint and the resistivities obtained for given constraint currents. In other words, for an element of given dimensions, this conditions the starting point of the resistance value, and accordingly the resistance values obtained for given constraint currents.

To be able to apply the right values, the different currents to be applied to switch from the different resistance values to lower values are predetermined, for example, by measurements. For example, a test resistor which is submitted to an increase by steps of the current is used, returning after each increase to the operating current range to measure the obtained resistance value. The measured values will follow curve Snom. Accordingly, the currents (I1, I2, FIG. 3) and the associated resistances (R1, R2) can be determined. The difference between the values of the table so obtained depends on the step selected for the increase by steps of the constraint current. This predetermination of course takes into account the nature of the polysilicon used, as well as preferentially that of the square resistance, that is, the resistivity of the material and the thickness with which it is deposited. Indeed, since the curves illustrated in FIG. 3 can also be read as curves of the square resistance, the calculated values can be transposed to the different resistors of an integrated circuit defined by the widths and the lengths of the resistive sections. The value of the constraint current to be applied to the resistive element to decrease its value in an irreversible and stable manner can then be predetermined. This determination enables setting voltage Vp used in the stabilization phase. It should be noted that due to the desired effect (remarkable decrease in the value of one of the two matched resistors), the accuracy of the constraint current is not critical provided it is greater than maximum current Im of the resistor. Preferably, a comfortable security margin will be provided to avoid for variations of voltage Vp or other circuit tolerances to prevent the obtaining of the value decrease. For example, the circuit will be parameterized according to a stabilization current providing a resistance value smaller than half the nominal value.

The curve change, that is, the decrease in the resistance value in normal operation, is almost immediate as soon as the corresponding constraint current is applied. "Almost immediate" means a duration of a few tens, or even hundreds of microseconds, which are sufficient to apply the corresponding constraint to the polysilicon bar and decrease the value of its resistance. This empirical value depends on the (physical) size of the bar. A duration of a few milliseconds may be chosen for security. Further, it can be considered that, once the minimum duration has been reached, no additional duration of application of the constraint current modifies, at least at the first order, the obtained resistance. Moreover, even if given the predetermination measurements, it is considered that the influence of the duration of application of the constraint cannot be neglected, the preferred embodiment (predetermining constraint values in duration and intensity) is perfectly compatible with taking into account the duration of application of the constraint.

As a specific example of embodiment, an N+ doped polysilicon resistor having a cross-section of 0.225 square micrometer (l=0.9 µm, e=0.25 µm) and a length L of 45 micrometers has been formed. With the polysilicon used and the corresponding doping, the nominal resistance was approximately 6,300 ohms. This corresponds to a resistance per square of approximately 126 ohms (50 squares). By applying to this resistor a current greater than three milliamperes, a decrease in its value, stable for an operation under currents reaching 500 microamperes, has been caused. With a current of 3.1 milliamperes, the value of the resistance has been lowered to approximately 4,500 ohms. By applying to the resistor a current of 4 milliamperes, the value of the resistance has been decreased down to approximately 3,000 ohms. The obtained resistance values have been the same for constraint durations ranging from 100 microseconds to more than 100 seconds.

Of course, the above examples as well as the given orders of magnitude of currents and resistances for the different ranges concern present technologies. The currents of ranges A1, A2, and A3 may be different (smaller) for more advanced technologies and may be transposed to current densities. The principle of the present invention is not modified by this. There are still three ranges and the intermediary range is used to force the resistivity decrease.

An advantage of the present invention is that it is compatible with conventional MOS transistor manufacturing technologies.

Another advantage of the present invention is that the value integrated in the resistors is not sensitive to ultraviolet rays.

Another advantage of the present invention is that the code stored in the storage element is not optically detectable, conversely to a polysilicon resistor which would be used as a fuse, where the physical damage on the silicon bar makes the programming visible.

Another advantage of the present invention is that the irreversible modification of the value of the programmed resistor is not destructive and thus does not risk damaging other circuit parts. This especially enables providing a decrease in the resistance value after manufacturing, and even during its lifetime in its application circuit.

Figure 4:
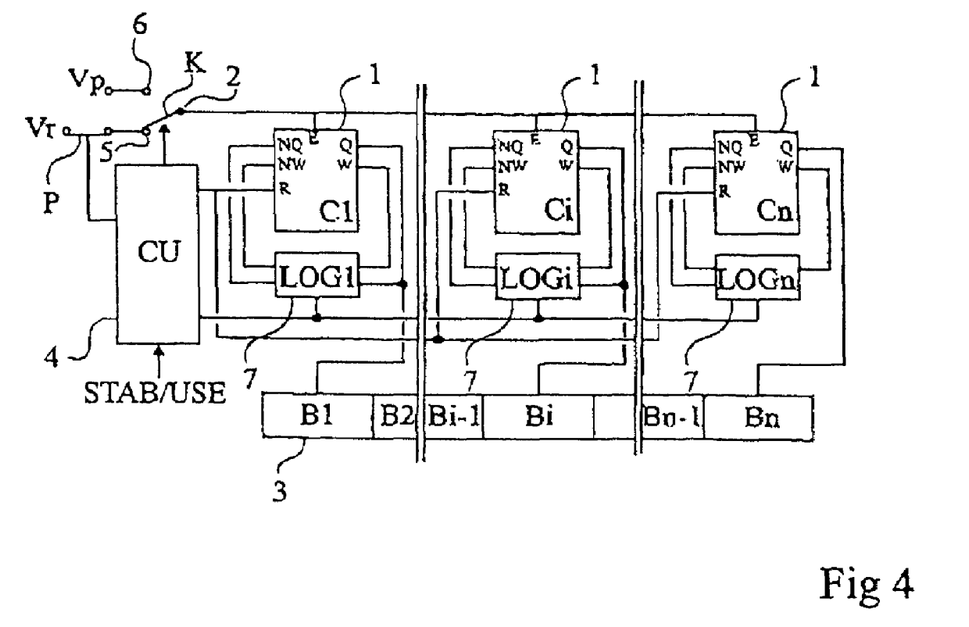
FIG. 4 shows, in the form of blocks, an embodiment of a circuit for storing and extracting a binary code according to an embodiment of the present invention.

FIG. 4 shows the electric diagram of an embodiment of an integrated storage circuit associating several cells 1 of the type of that shown in FIG. 1, to extract a binary word or a code over several bits.

In this example, the circuit comprises a single input terminal 2 of application, according to the operating phase, of voltage Vp or of a read edge at level Vr. The circuit provides a binary code B1, B2, . . . Bi−1, Bi, . . . , Bn−1, Bn over a predetermined number n of bits. Each bit Bi is provided by an output (for example, Q) of a cell Ci (i ranging between 1 and n). In the example of FIG. 4, the different Q outputs of flip-flops 1 are individually connected to the input of a register 3 for storing the obtained binary code. The connection and structure details of register 3 have not been described in detail. Once the binary code is contained in the register, its exploitation depends on the application, and its implementation is within the abilities of those skilled in the art.

The circuit of FIG. 4 comprises a central unit 4 (CU) common to all cells 1. Unit 4 especially has the function of placing all cells in a read or stabilization operation. For example, unit 4 controls a selector K of connection of terminal 2 between a terminal 6 of application of D.C. voltage Vp and a terminal 5 on which will be applied, in read mode, a digital signal (edge of amplitude Vr) for triggering the code extraction. For example, a switch P (for example, a MOS transistor) connects terminal 5 to a terminal of application of voltage Vr.

Unit 4 also generates a control signal for terminals R of cells Ci to place said cells in a read or stabilization configuration, as well as a signal for controlling switch P. In the example shown where the reading is performed in parallel, all terminals R of cells Ci are connected together to the corresponding terminal of unit 4. As an alternative, cells Ci may be individually addressed (for example, cyclically) in read mode, for a series extraction of the different bits. It should then be ascertained to maintain the extraction signal high (turning-on of switch P) for the time necessary to extract all the bits.

To enable stabilization or confirmation of a cell, it is necessary to extract its content a first time therefrom and accordingly control the conduction of transistor MN3$g$ or MN3$d$. For this purpose, each cell Ci is associated with a logic read and interpretation circuit 7 (LOGi) in the stabilization phase.

Each circuit 7 comprises two detection inputs respectively connected to terminals Q and NQ of the cell, two control outputs respectively connected to control terminals W and NW of transistors MN3$d$ and MN3$g$ of the cell, and an input control terminal intended to receive a signal for controlling (activating/deactivating) unit 4. To simplify, the input/output terminals of circuit 7 which are connected to cell 1 will be designated with the references of the terminals of this cell. Preferably, the stabilization of all cells is performed in parallel, whereby each one is associated with its logic circuit 7.

When the code must be stabilized, for example, in a first use of the circuit, or in a testing phase after manufacturing, a control signal STAB/USE received by unit 4 starts a stabilization phase.

Unit 4 starts causing an extraction of all bits. To achieve this, it places selector K in a state where it selects terminal 5, turns on transistors MN2 and activates circuits LOGi, then causes a switching to the high state of the signal applied on terminal 5. For this purpose, unit 4 turns on switch P in order to have a positive edge appear on terminals E of the cells. The time during which switch P is on corresponds to the duration of a normal extraction. In each cell, a state 0 or 1 then appears on its Q output. Preferably, all cells have resistor pairs Rg and Rd of same values.

The stabilization will be described in relation with one cell, knowing however that it is performed similarly for the other cells.

Initially, outputs W and NW of circuits LOGi are idle (low), so that both transistors MN3 are off. As soon as circuit LOGi detects a state 1 on one of its inputs Q, respectively NQ, it switches its output W, respectively NW, to the high state, to turn on transistor MN3$d$, respectively, MN3$g$, and locks this conductive state as well as a low state on its other output NW, respectively, W. This locking of the low state enables freezing the control by circuit LOGi even when the turn-on switching of one of transistors MN3 inverts the state of the cell outputs. As an alternative, it may be provided to disable the detection of the states on the Q and NQ inputs as soon as a high state has been detected thereon.

According to a first embodiment corresponding to the shown embodiment, unit 4 starts, after a predetermined time chosen to be longer (with a security margin) than the maximum possible locking duration of the different circuits LOGi (which thus depends on the maximum time constant of the different paths of the cells, in particular if different cells have different nominal values of resistance pairs), the turning-off of transistors MN2 (low state on all inputs R), followed by the switching of selector K to terminal 6. This results in the flowing of a stabilization current (on the order of a few milliamperes) in one of the resistors of each cell (that corresponding to the shortest detected time constant). This current with a value predetermined according to the nominal characteristics of the resistors of FIG. 1, as discussed in relation with FIG. 3, is maintained, for example, for a duration of a few milliseconds. This causes, in each cell, an irreversible and stable decrease in the value of the resistor associated with the shortest time constant, thus confirming the cell state.

Then, unit 4 deactivates the stabilization phase by switching selector K back to terminal 5 (without however triggering a new extraction by the turning-on of switch P) and by deactivating logic circuits LOGi. Unit 4 may also switch the control signal of inputs R to a high state. As an alternative, this signal is placed in the high state for each extraction phase, which minimizes the power consumption outside of extraction phases.

The state of each cell is thus now stabilized (confirmed) without this being detectable. Indeed, resistors Rd and Rg of each cell still have the same dimensions.

According to an alternative embodiment, each logic circuit LOGi is associated with a selector between levels Vp and Vr and accordingly comprises a control logic. In this case, it is not necessary for all cells to switch to level Vp at the same time.

In principle, the stabilization step is only performed once. However, it is not disturbing for it to be reproduced. It will only confirm the same state.

An advantage of the present invention is that no particular precaution is to be taken to differentiate the electric paths storing the code. On the contrary, the resistors are manufactured identically, which further increases the code dissimulation.

Another advantage of the present invention is that the code thus stored does not risk being detected, even by power analysis. Indeed, the power consumption of a cell remains unchanged in read mode, whatever that of resistors Rd and Rg which has seen its value decrease.

Other embodiments applied to a confirmation of resistance differences in a differential structure read by a current or voltage measurement will be described hereafter. These embodiments use the advantages indicated in relation with the above description of the embodiment using time, especially those which are linked to the use of polysilicon resistors programmable by irreversible decrease in their values.

Figure 5:
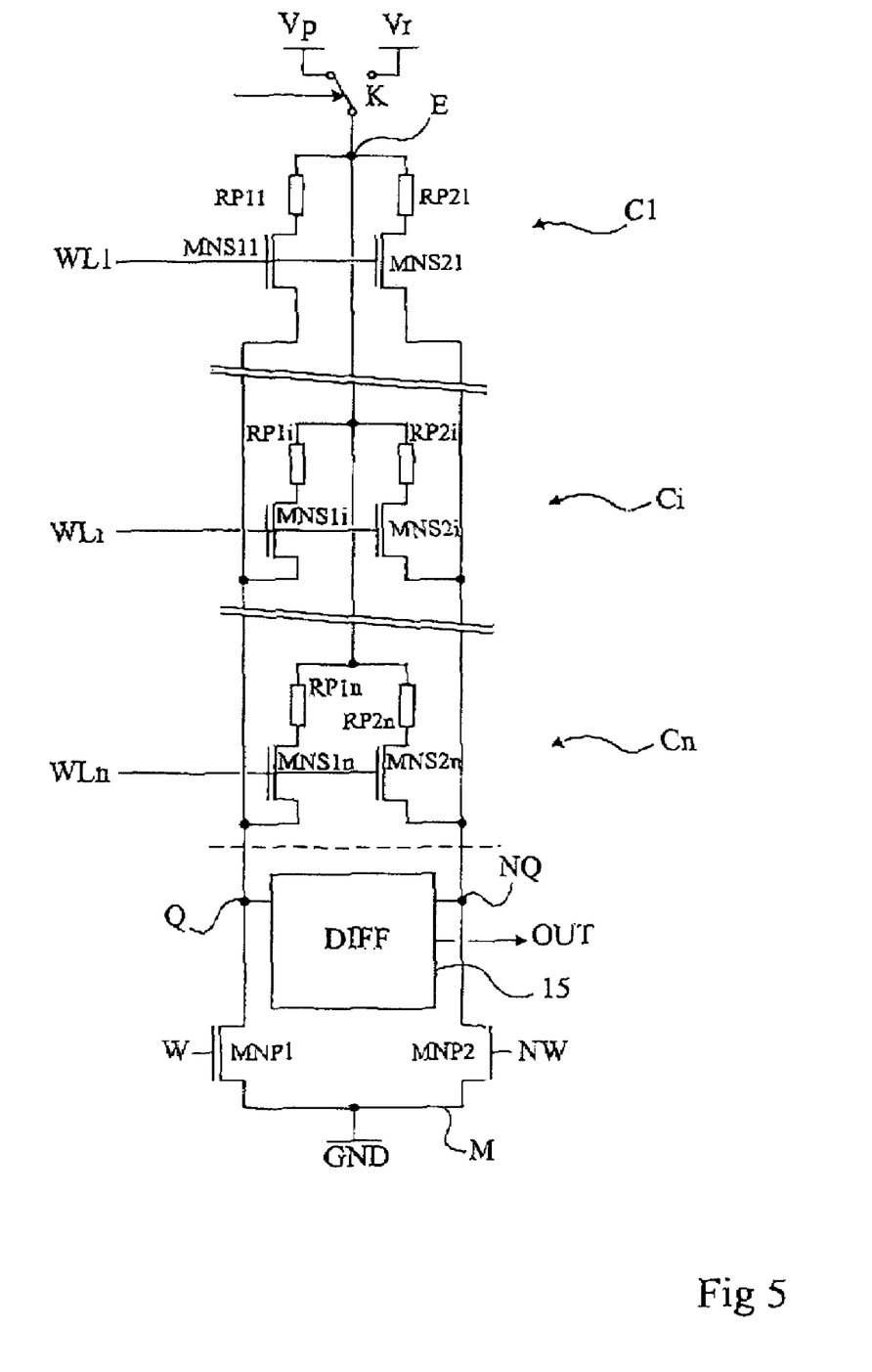
FIG. 5 shows the electric diagram of a storage cell column according to another embodiment of the present invention.

FIG. 5 shows a columns of storage cells C1, ... Ci, ... Cn according to one embodiment. This drawing illustrates the possibility of associating cells with programming resistors specific to the present invention in an array network. For simplification, FIG. 5 only shows a single column. It should however be noted that several parallel columns may be provided.

Each memory cell Ci of the column is formed of two parallel branches each comprising, between a terminal E of application of the activation signal and a respective terminal Q or NQ intended to be read by a differential read element 15, a programmable resistor RP1$i$, respectively, RP2$i$, and a switch (here, an N-channel MOS transistor) MNS1$i$, respectively MNS2$i$, of selection of the column cell. Terminals Q and NQ, corresponding to input terminals of differential amplifier 15 of to output terminals of the cell arrangement, are respectively connected to ground GND via confirmation transistors MNP1 and MNP2 used in the stabilization phase.

The different memory cells Ci are thus in parallel between terminal E and terminals Q and NQ. In the example shown, terminal E is connected to respective read and stabilization supply voltages Vr and Vp via a switch K controlled by a control circuit (not shown) according to the operating range.

In the example shown, transistors MNP1 and MNP2 receive respective signals W and NW from the control circuit. As an alternative, and as will be seen hereafter in relation with some embodiments of the differential amplifier, signals W and NW may be one and the same stabilization control signal.

In the circuit of FIG. 5, selection transistors MNS1$i$ and MNS2$i$ of each cell are controlled together by respective word line selection signals WL$i$. This word line notation is used by referring to the usual designations of the lines and columns in a memory plane. As an alternative, the signals for selecting lines WL$i$ may be divided into two separate signals of selection of one branch with respect to the other, especially if this is required for the stabilization, while a single control signal is used for transistors MNP1 and MNP2 simultaneously.

From the foregoing discussion, it can be seen that each cell comprises, in parallel between two terminals of application of a supply voltage, two branches, each comprising a polysilicon resistor, and at least one read switch (MNS) connecting each resistor to an output terminal.

Different examples of implementation of differential read elements 15 will be described hereafter in relation with FIGS. 6 and 7. The read or selection transistors have been omitted therein due to the singleness of the read element for a single column of cells such as illustrated in FIG. 5.

Transistors MNP1 and MNP2 have been shown to better show the link with FIG. 5. It should however be noted that said transistors do not actually belong to the differential read elements.

Figure 6:
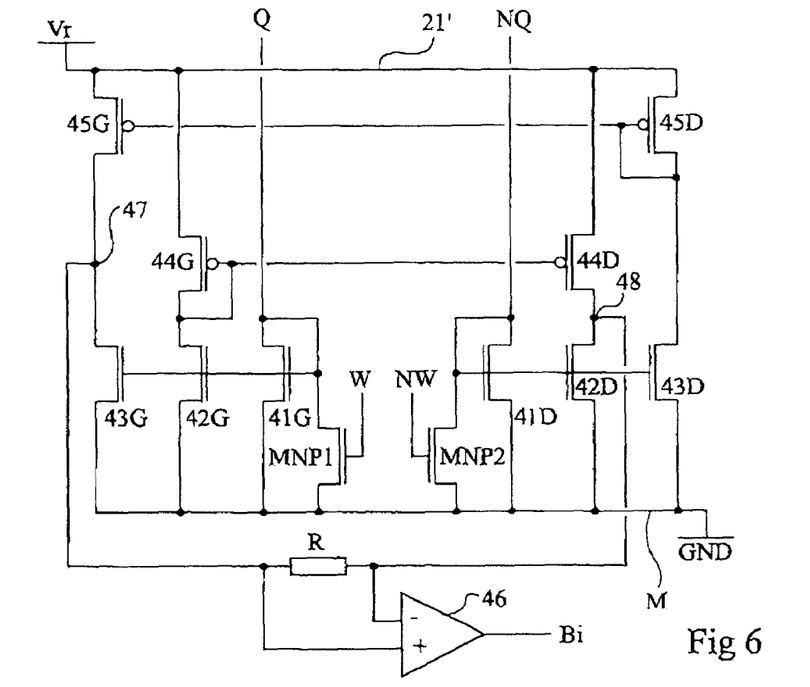
FIG. 6 shows the electric diagram of an embodiment of the differential read amplifier of FIG. 5.

FIG. 6 shows a first example of a differential read amplifier 15 detecting a current difference between the two branches of a cell.

The drawing of FIG. 6 is based on the use of two transconductance amplifiers, each comprising at least two parallel current mirror branches. In the example shown, three branches in parallel are provided for each of the output branches (Q and NQ) of the memory cell.

For example, on the side of terminal Q (arbitrarily, on the side of the left branch in the orientation of the drawing), each branch comprises a transistor 41G, 42G and 43G, respectively (for example, N-channel MOS transistors) assembled as current mirrors. Transistor 41G connects terminal Q to ground and is diode-assembled, its gate and its drain being interconnected. Transistor 42G of the second branch is connected by its source to terminal M and by its drain to the drain of a P-channel MOS transistor 44G, the source of which is connected to line 21' of the supply of read voltage Vr. On the side of the third branch, transistor 43G is connected to supply line Vr via a P-channel MOS transistor 45G, the source of transistor 43G being grounded.

The same structure is reproduced on the right-hand side of the drawing for the connection of terminal NQ. Transistor 41D of the first branch is also diode-assembled. Transistor 44D of the second branch has its gate connected to that of transistor 44G on which it is assembled as a current mirror, transistor 44G being diode-assembled with its gate interconnected to its drain. On the side of the third branch, transistor 45D is diode-assembled with its gate interconnected to its drain and has its gate connected to the gate of transistor 45G of the left-hand branch.

The differential measurement is performed by means of an operational amplifier 46, the respective inverting and non-inverting inputs of which are connected to points 47 and 48 of interconnection of transistors 45G, 43G of the third left-hand branch, and 44D and 42D of the second right-hand branch.

Further, a measurement resistor R connects the input terminals of amplifier 46. Output OUT of amplifier 46 provides the state of the read cell.

An advantage of the embodiment of FIG. 6 is that it enables getting rid of possible dissymmetries of the structures of the selection MOS transistors and, more precisely, dissymmetries between the capacitances present in the circuit. It thus is a pure resistance measurement amplifier.

It should be noted that, like for the supply of amplifier 46 of FIG. 6, only read voltage Vr supplies the current mirrors.

Figure 7:
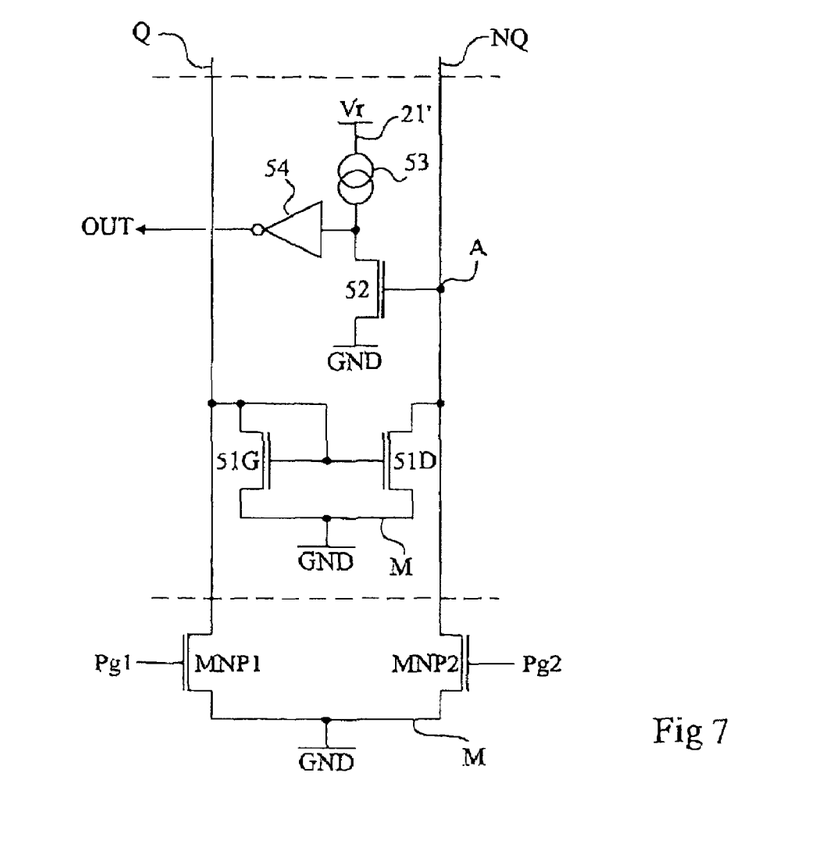
FIG. 7 shows the electric diagram of another embodiment of the differential read circuit of FIG. 5.

FIG. 7 shows another example of a differential read amplifier applicable to the storage cells of FIG. 5. The reading is here performed on voltages. The amplifier is formed of two MOS transistors (here, with N channels 51G and 51D) respectively connecting terminals Q and NQ to ground M, one of the transistors (for example, 51G) being diode-assembled and the gates of transistors 51G and 51D being interconnected. It thus is a current mirror balancing the voltages across terminals Q and NQ in read mode. The current mirror amplifies the shifting, the left-hand branch setting the current for the other branch. Accordingly, if the resistance of the left-hand branch Q of the selected cell is smaller than the right-hand resistance of this cell, a stronger current flows through this left-hand branch. Since the current mirror of the other branch surges the same current, the fact that its resistance is larger results in voltage read point A dropping to a low voltage (the ground, neglecting the series resistances of the on-state transistors). Point A is connected to the gate of a read MOS transistor 52, connected in series with a constant current source 53 between terminal 21' of application of read voltage Vr and ground M. The junction point of transistor 52 and terminal 53 may cross an inverter 54, the output terminal of which provides the state of the selected cell. When point A is at a voltage close to ground, transistor 52 is off. In the opposite case, this transistor is on. A switching of output OUT of the differential read amplifier is thus effectively obtained.

According to an alternative embodiment, the read point (gate of transistor 52) is connected to line Q provided that transistor 51D of the line be the diode-assembled transistor.

As with the assembly of FIG. 6, when a stabilization of one of the memory cells is desired to be performed, said cell is selected by means of its signal WLi (FIG. 5) and the transistor MNP1 or MNP2 of the branch of which the value of its polysilicon resistor is desired to be decreased is turned on (signals Pg1 and Pg2).

Figure 8:
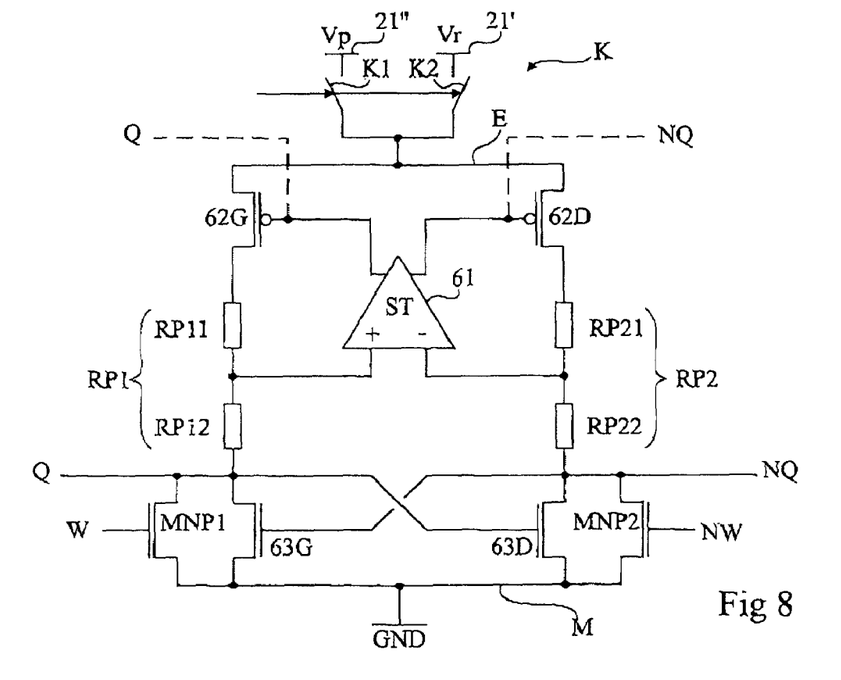
FIG. 8 shows the electric diagram of a storage cell according to another embodiment of the present invention.

FIG. 8 shows another embodiment of an extraction cell according to the present invention. This cell is based on the use of a hysteresis comparator or amplifier (commonly called a Schmitt trigger) 61 forming at the same time a differential read element.

As with the other embodiments, the cell comprises two parallel branches comprising, each in series between terminals E and M of application of a supply voltage, a resistive differentiation element RP1, RP2 and at least one switch forming a confirmation transistor MNP1, MNP2. In the example of FIG. 8, each branch also comprises, for its reading, a P-channel MOS transistor 62G, 62D connecting terminal E to a first terminal of resistive element RP1, RP2, respectively, and an N-channel MOS transistor 63G, 63D respectively connecting the other terminal of resistive element RP1, RP2 to ground M. The respective gates of transistors 63G and 63D are connected to the drain of the opposite transistor, that is, to the respective drains of programming transistors MNP1 and MNP2.

Resistive elements RP1 and RP2 are each formed of two resistors in series RP11, RP12 and RP21, RP22, the respective junction points of which are connected to the non-inverting and inverting inputs of Schmitt trigger 61. The respective outputs of the Schmitt trigger are connected to the gates of transistors 62G and 62D.

Positive terminal E is connected to voltages Vp and Vr by means of a switch circuit K. Here, an alternative switch circuit has been illustrated in the form of two switches K1 and K2 respectively connecting terminals 21' and 21" of application of voltages Vr and Vp to terminal E. Of course, switches K1 and K2 are not simultaneously on.

In read mode, as soon as the cell is supplied under voltage Vr, Schmitt trigger 61 turns on the two transistors 62G and 62D. The flip-flop assembly of the bottom of the cell (transistors 63G and 63D) detects the imbalance between resistors RP1 and RP2. Trigger 61 reads this imbalance and turns off transistor 62G or 62D of the branch having the highest resistance value RP1 or RP2.

An advantage of the memory cell of FIG. 8 is that once the reading has been performed, no current flows through the cell.

Another advantage of the presence of trigger 61 is that it enables detection of a small imbalance without waiting for flip-flop 63G, 63D to have completely turned off one of transistors 63G and 63D.

In the example shown, the respective direct and inverse outputs Q and NQ of the cell are formed by the gates of transistors 63D and 63G. As an alternative and as illustrated in dotted lines in FIG. 8, the gates of transistors 62G and 62D (the outputs of the Schmitt trigger) may also be used as cell outputs.

To confirm the initial (manufacturing) state of the cell, signals Pg1 and Pg2 are confounded. Transistors MNP1 and MNP2 are simultaneously turned on. The programming or stabilization then confirms the initial state by decreasing the value of resistance RP1 or RP2 which, in the state after manufacturing, already exhibits a slightly lower value.

It should be noted that the embodiment of FIG. 8 is compatible with the use of a single supply voltage, the voltage being then set to the level of stabilization or programming voltage Vp. Indeed, in read mode, as soon as the state is confirmed by the Schmitt trigger, there is no risk of programming the resistors since there is no more current. To achieve this, the read current should not last long enough to cause a programming. In other words, the duration of application of the cell supply voltage must be chosen to be sufficiently short to be compatible with the use of a single supply voltage.

In the case where both voltages are used, Schmitt trigger 61 is supplied under voltage Vr.

Figure 9:
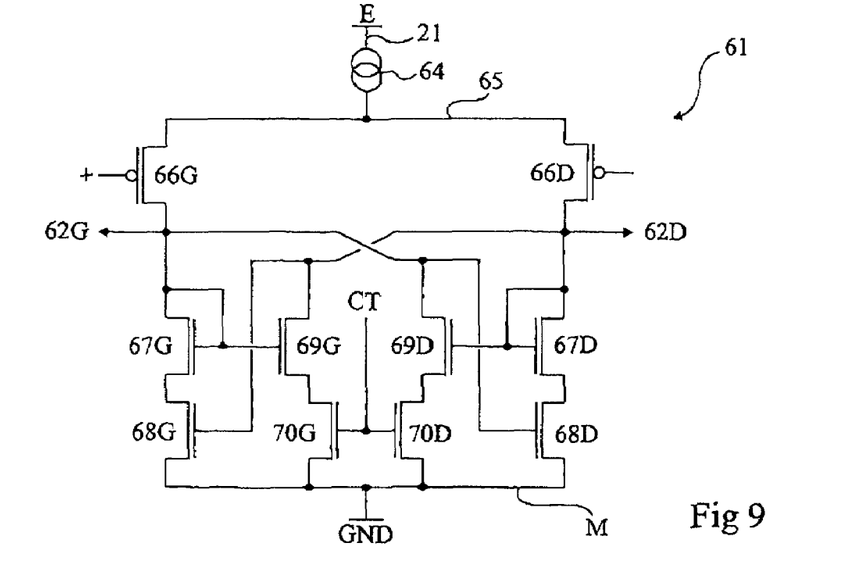
FIG. 9 shows an example of implementation of an amplifier with a Schmitt trigger used in the embodiment of FIG. 8.

FIG. 9 illustrates an example of implementation of Schmitt trigger 61 of FIG. 8. The trigger comprises two symmetrical structures in parallel between a current source 64 supplied by voltage Vp or Vr (terminal 21) and ground M. Each structure comprises, between output terminal 65 of source 64 and the ground, a P-channel MOS transistor 66D or 66G, the respective gates of which form the inverting and non-inverting input terminals − and +, and the respective drains of which define the output terminals connected to the gates of transistors 62G and 62D. Each of terminals 62G and 62D is connected to ground M by a series association of two N-channel MOS transistors 67G, 68G and 67D, 68D. Transistors 67G and 67D are diode-connected, their respective gates and drains being interconnected. The respective gates of transistors 68G and 68D are connected to the drains of transistors 67D and 67G of the opposite branch. An N-channel MOS transistor 69G or 69D respectively is assembled as a current mirror on transistors 67G and 67D. These transistors are connected between terminals 62D and 62G respectively and, via two N-channel MOS transistors 70G and 70D, to ground M to guarantee the hysteresis during the reading. The gates of transistors 70G and 70D receive a control signal CT active only during the reading and turning off transistors 70G and 70D to avoid power consumption in the amplifier after a reading.

The operation of a Schmitt trigger 61 such as illustrated in FIG. 9 is well known. As soon as an imbalance appears between the voltage level of one of the − or + inputs (gates of transistors 66D and 66G), this imbalance is locked due to the crossed current mirror structure of the low portion of the assembly.

Figure 10:
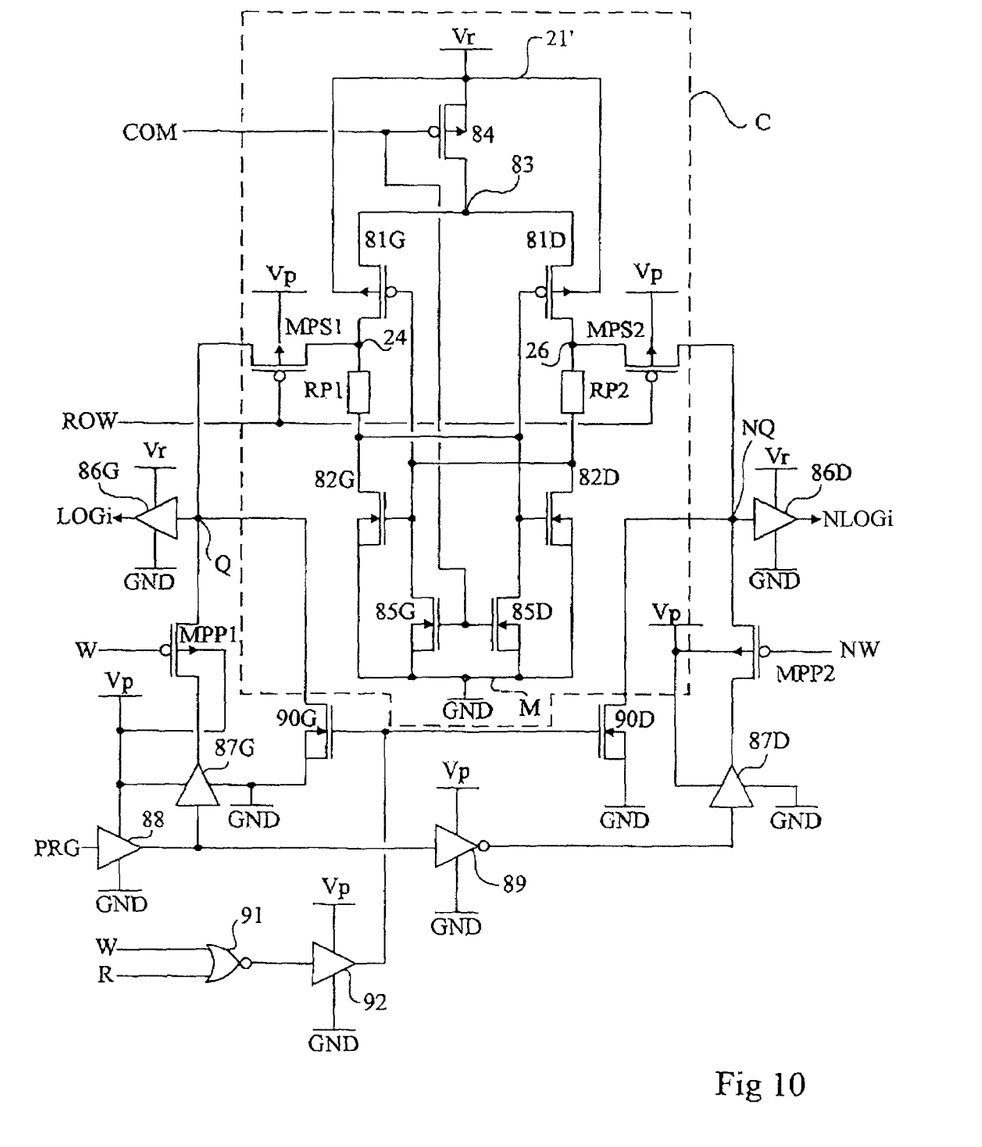
FIG. 10 shows the electric diagram of a storage cell according to another embodiment of the present invention.

FIG. 10 shows a third embodiment of a cell according to the present invention.

The actual cell C comprises two parallel branches each formed of a P-channel MOS transistor 81G, 81D, of a programming resistor RP1, RP2, of an N-channel MOS transistor 82G, 82D between a terminal 83 connected to read supply voltage Vr (terminal 21') via a P-channel MOS transistor 84, and ground M. Transistor 84 is intended to be controlled by a signal COM for supplying the structure in a reading. When off, no power consumption occurs in the previously-described parallel branches. Signal COM is also sent to the gates of two N-channel MOS transistors 85G, 85D connected between the respective gates of transistors 81G and 81D and the ground. The gates of transistors 81G and 82G are interconnected to the drain of transistor 82D while the gates of transistors 81D and 82D are interconnected to the drain of transistor 82G, to stabilize the read state.

Terminals 24, 26 of resistors RP1 and RP2 opposite to transistors 82 are respectively connected, via P-channel selection MOS transistors MPS1 and MPS2, to output terminals Q and NQ of the cell. Optionally, terminals Q and NQ are connected via follower amplifiers or level adapters 86G and 86D generating logic state signals LOGi and NLOGi of bit lines of the structure. Selection transistors MPS1 and MPS2 are controlled by a signal ROW of selection of the cell in a column of the type shown in FIG. 5. With a simple reading of the cell, the previously-described structure effectively enables obtaining, on terminals Q and NQ, the programmed state of the cell identified by the value difference of resistances RP1 and RP2, minute though it may be. This difference is amplified and the cell state is stabilized due to its crossed structure.

The stabilizing of a cell such as illustrated in FIG. 10 is performed by means of two stabilization transistors MPP1 and MPP2 (here, P-channel MOS transistors) having their respective drains connected to terminals Q and NQ (as in the preceding drawings), and the respective sources of which are intended to receive stabilization voltage Vp. The gates of transistors MPP1 and MPP2 receive signals Pg1 and Pg2. It should however be noted that, since P-channel MOS transistors are involved, the states of these signals must be reversed with respect to the previously-described structures using N-channel transistors.

Before cell selection, transistors MPS1 and MPS2 are both blocked by signal ROW. The structure is thus isolated.

A reading starts with setting to the high state signal COM which applies a low level to all the nodes of the cell structure. When signal COM is reset, the gates of transistors 81D and 85D are charged through resistor RP1 while the gates of transistors 81G and 85G are charged through resistor RP2, the gate capacitances being equivalent by symmetry. Assuming that resistor RP1 exhibits the lowest value, the drain of transistor 82G has a voltage greater than the drain of transistor 82D. This reaction is amplified to provide a high level on terminal 24 and a low level on terminal 26. This operation is carried out only once as long as supply voltage Vr is maintained.

To be read from, this cell is selected by the setting to the high state of signal ROW. Transistors MPS1 and MPS2 are then turned on, which enables transferring the state of nodes 24 and 26 onto terminals Q and NQ, and thus onto the bit lines Q and NQ generating logic output signals LOGi and NLOGi.

To stabilize the cell of FIG. 10, it is started from a state where selection transistors MPS1 and MPS2 are off. Signal COM is switched high to draw the respective drains of transistors 82G and 82D to ground. Since transistor 84 is off, any current leakage to supply Vr is impossible.

A sufficient voltage level (Vp) is then applied by means of one of transistors MPP1 and MPP2 on terminal Q or NQ according to the resistor RP1 or RP2 which is desired to be programmed by an irreversible decrease in its value. Then, transistors MPS1 and MPS2 are turned off by the switching of signal ROW. The programming voltage is immediately transferred onto the resistor to be programmed, while the opposite node NQ or Q remains floating.

The programming and read voltages may be different as will be discussed hereafter.

In the assembly illustrated in FIG. 10, the respective sources of transistors MPP1 and MPP2 are connected to the outputs of follower elements 87G and 87D supplied by programming voltage Vp. The respective inputs of follower elements 87G and 87D receive voltage Vp by means of a follower amplifier 88, the input of which receives a binary signal PRG for triggering a programming and the output of which is directly connected to the input of amplifier 87G and, via an inverter 89 supplied by voltage Vp, to the input of amplifier 87D. The function of inverter 89 is to select that of the branches to be submitted to voltage Vp according to the state of signal PRG. In this case, transistors MPP1 and MPP2 may be controlled by the same signal. In the absence of an inverter 89, separate signals Pg1 and Pg2 are used.

To avoid accidental inversion of the cell state when the selection transistors are on due to the precharge level on uncontrolled lines of the structure, two transistors, respectively 90G and 90D (here, N-channel MOS transistors), connecting lines Q and NQ, respectively, to ground, are provided. These transistors are simultaneously controlled by a combination of signals W and R respectively indicative by a high state of a write phase and of a read phase. These two signals are combined by a XNOR-type gate 91, the output of which passes through a level-shifting amplifier 92, supplied by voltage Vp, before driving the gates of transistors 90G and 90D. This structure enables drawing nodes Q and NQ to ground before each read operation.

The generation of the control signals of the structure of FIG. 10 is within the abilities of those skilled in the art based on the functional indications given hereabove.

Of course, the present invention is likely to have various alterations, modifications, and improvement which will readily occur to those skilled in the art. In particular, the sizing of the polysilicon resistors to obtain a nominal value depends on the application and is within the abilities of those skilled in the art based on the functional indications given hereabove. Further, the values of the voltage or current constraints to implement the present invention are within the abilities of those skilled in the art based on the functional indications given hereabove. Further, although the present invention has been described in relation with N-channel MOS transistors, its structure easily transposes to P-channel MOS transistors, the cell resistors being then connected to the lowest (negative) supply potential. Finally, it should be noted that the present invention can easily be transposed from one technology to another.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of operating an integrated circuit memory cell comprising a first resistor having a first resistance value and a second resistor, the method comprising:
    applying a stabilization input signal to the first resistor;
    wherein the stabilization input signal has a magnitude that is sufficient to cause a permanent, non-destructive lowering of the first resistance value of the first resistor; and
    lowering the first resistance value of the first resistor using the stabilization input signal.

2. The method of claim 1, wherein the stabilization input signal comprises several discrete magnitudes applied in an increasing stepwise fashion.

3. The method of claim 2, further comprising:
    measuring the resistance value of the first resistor after each stepwise increase in magnitude.

4. The method of claim 1, further comprising:
    applying an extraction signal to the first resistor and the second resistor.

5. The method of claim 4, wherein applying the extraction signal to the first resistor and the second resistor corresponds to a reading of the integrated circuit memory cell to determine which of the first resistance value and a second resistance value of the second resistor is greater.

6. The method of claim 4, wherein the application of the extraction signal to the first resistor and the second resistor lasts for a duration less than the application of the stabilization input signal to only one of the first resistor or the second resistor.

* * * * *